US011293997B2

(12) United States Patent
Kishibe et al.

(10) Patent No.: US 11,293,997 B2
(45) Date of Patent: *Apr. 5, 2022

(54) DIAGNOSTIC APPARATUS

(71) Applicant: PANASONIC INTELLECTUAL PROPERTY MANAGEMENT CO., LTD., Osaka (JP)

(72) Inventors: Taro Kishibe, Hyogo (JP); Hideyuki Kishida, Osaka (JP); Yusuke Shimogaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 269 days.

This patent is subject to a terminal disclaimer.

(21) Appl. No.: 16/617,405

(22) PCT Filed: Apr. 17, 2018

(86) PCT No.: PCT/JP2018/015783
§ 371 (c)(1),
(2) Date: Nov. 26, 2019

(87) PCT Pub. No.: WO2018/221043
PCT Pub. Date: Dec. 6, 2018

(65) Prior Publication Data
US 2020/0408852 A1 Dec. 31, 2020

(30) Foreign Application Priority Data
May 31, 2017 (JP) .............................. JP2017-108699

(51) Int. Cl.
*G01R 31/56* (2020.01)
*G01R 31/327* (2006.01)
*H02P 29/024* (2016.01)

(52) U.S. Cl.
CPC ......... *G01R 31/56* (2020.01); *G01R 31/3275* (2013.01); *H02P 29/024* (2013.01)

(58) Field of Classification Search
CPC .... G01R 31/3275; G01R 31/56; H02P 29/024
See application file for complete search history.

(56) References Cited

U.S. PATENT DOCUMENTS

2006/0214618 A1    9/2006  Hashimoto et al.
2011/0199035 A1    8/2011  Ooto et al.
(Continued)

FOREIGN PATENT DOCUMENTS

| JP | 2006-268130 A | 10/2006 |
| JP | 2010-104187 A | 5/2010 |
| JP | 5429181 B2 | 2/2014 |

OTHER PUBLICATIONS

International Search Report and Written Opinion dated Jun. 19, 2018 in International Patent Application No. PCT/JP2018/015783; with partial English translation.

*Primary Examiner* — Jeff W Natalini
(74) *Attorney, Agent, or Firm* — McDermott Will & Emery LLP

(57) ABSTRACT

A diagnostic apparatus includes a control device and an extension device connectable to the control device. The control device includes one or more cutoff blocks that switch between allowing and cutting off power supply to a load, a first diagnostic pulse generator that generates a diagnostic signal indicating that the power to the load is to be cut off, a first cutoff diagnosing device that detects a supply voltage to the load, and an extension device detector that determines whether the extension device is connected to the control device. The extension device includes a second diagnostic pulse generator that generates a diagnostic signal, and a second cutoff diagnosing device that detects a supply voltage to the load.

6 Claims, 11 Drawing Sheets

(56) References Cited

U.S. PATENT DOCUMENTS

| | | | |
|---|---|---|---|
| 2015/0168475 A1* | 6/2015 | Kalberer | G05B 19/0428 |
| | | | 324/538 |
| 2017/0083078 A1* | 3/2017 | Prathaban | G06F 13/4282 |
| 2017/0197730 A1* | 7/2017 | Lutze | H02K 19/34 |
| 2017/0257089 A1* | 9/2017 | Zehetbauer | G01R 31/42 |
| 2018/0102706 A1* | 4/2018 | Gao | H02M 3/02 |

* cited by examiner

FIG. 3

|  | EXTENSION DEVICE 21 IS CONNECTED | EXTENSION DEVICE 21 IS NOT CONNECTED |
|---|---|---|
| EXTENSION DEVICE DETECTOR 15 HAS DETERMINED THAT EXTENSION DEVICE 21 IS CONNECTED | [I] DIAGNOSIS OF CUTOFF BLOCK 31 CAN BE MADE PROPERLY WITH DIAGNOSIS MADE BY EXTENSION DEVICE 21 | [II] FIRST CUTOFF DIAGNOSING DEVICE 9a OF CONTROL DEVICE 20 DETERMINES THAT DIAGNOSIS IS NOT MADE PERIODICALLY, AND LOAD IS STOPPED DUE TO DIAGNOSIS ANOMALY |
| EXTENSION DEVICE DETECTOR 15 HAS DETERMINED THAT EXTENSION DEVICE 21 IS NOT CONNECTED | [III] DIAGNOSIS IS MADE BY EACH OF CONTROL DEVICE 20 AND EXTENSION DEVICE 21, AND LOAD IS STOPPED DUE TO DIAGNOSIS ANOMALY | [IV] DIAGNOSIS OF CUTOFF BLOCK 31 CAN BE MADE PROPERLY WITH DIAGNOSIS MADE BY CONTROL DEVICE 20 |

FIG. 5

| | EXTENSION DEVICE 21 IS CONNECTED | EXTENSION DEVICE 21 IS NOT CONNECTED |
|---|---|---|
| EXTENSION DEVICE DETECTOR 15 HAS DETERMINED THAT EXTENSION DEVICE 21 IS CONNECTED | [ I ] DIAGNOSIS OF CUTOFF BLOCK 31 CAN BE MADE PROPERLY WITH DIAGNOSIS MADE BY EXTENSION DEVICE 21 | [ II ] THIRD CUTOFF DIAGNOSING DEVICE 9c OF CONTROL DEVICE 20a DETERMINES THAT DIAGNOSTIC SIGNAL FROM EXTENSION DEVICE 21 IS NOT OUTPUT, AND LOAD IS STOPPED DUE TO DIAGNOSIS ANOMALY |
| EXTENSION DEVICE DETECTOR 15 HAS DETERMINED THAT EXTENSION DEVICE 21 IS NOT CONNECTED | [ III ] DIAGNOSIS IS MADE BY EACH OF CONTROL DEVICE 20a AND EXTENSION DEVICE 21, AND LOAD IS STOPPED DUE TO DIAGNOSIS ANOMALY | [ IV ] DIAGNOSIS OF CUTOFF BLOCK 31 CAN BE MADE PROPERLY WITH DIAGNOSIS MADE BY CONTROL DEVICE 20a |

FIG. 8

|  | EXTENSION DEVICE 121 IS CONNECTED | EXTENSION DEVICE 121 IS NOT CONNECTED |
|---|---|---|
| EXTENSION DEVICE DETECTOR 115 HAS DETERMINED THAT EXTENSION DEVICE 121 IS CONNECTED | [I] DIAGNOSIS OF CUTOFF CIRCUIT 131 CAN BE MADE PROPERLY WITH DIAGNOSIS MADE BY EXTENSION DEVICE 121 | [II] FIRST CUTOFF DIAGNOSING DEVICE 109a OF MOTOR CONTROLLING DEVICE 110 DETERMINES THAT DIAGNOSIS IS NOT MADE PERIODICALLY, AND MOTOR IS STOPPED DUE TO DIAGNOSIS ANOMALY |
| EXTENSION DEVICE DETECTOR 115 HAS DETERMINED THAT EXTENSION DEVICE 121 IS NOT CONNECTED | [III] DIAGNOSIS IS MADE BY EACH OF MOTOR CONTROLLING DEVICE 110 AND EXTENSION DEVICE 121, AND MOTOR IS STOPPED DUE TO DIAGNOSIS ANOMALY | [IV] DIAGNOSIS OF CUTOFF CIRCUIT 131 CAN BE MADE PROPERLY WITH DIAGNOSIS MADE BY MOTOR CONTROLLING DEVICE 110 |

FIG. 10

| | EXTENSION DEVICE 121 IS CONNECTED | EXTENSION DEVICE 121 IS NOT CONNECTED |
|---|---|---|
| EXTENSION DEVICE DETECTOR 115 HAS DETERMINED THAT EXTENSION DEVICE 121 IS CONNECTED | [I] DIAGNOSIS OF CUTOFF CIRCUIT 131 CAN BE MADE PROPERLY WITH DIAGNOSIS MADE BY EXTENSION DEVICE 121 | [II] THIRD CUTOFF DIAGNOSING DEVICE 109c OF MOTOR CONTROLLING DEVICE 110a DETERMINES THAT DIAGNOSTIC SIGNAL FROM EXTENSION DEVICE 121 IS NOT OUTPUT, AND MOTOR IS STOPPED DUE TO DIAGNOSIS ANOMALY |
| EXTENSION DEVICE DETECTOR 115 HAS DETERMINED THAT EXTENSION DEVICE 121 IS NOT CONNECTED | [III] DIAGNOSIS IS MADE BY EACH OF MOTOR CONTROLLING DEVICE 110a AND EXTENSION DEVICE 121, AND MOTOR IS STOPPED DUE TO DIAGNOSIS ANOMALY | [IV] DIAGNOSIS OF CUTOFF CIRCUIT 131 CAN BE MADE PROPERLY WITH DIAGNOSIS MADE BY MOTOR CONTROLLING DEVICE 110a |

DIAGNOSTIC APPARATUS

CROSS-REFERENCE OF RELATED APPLICATIONS

This application is the U.S. National Phase under 35 U.S.C. § 371 of International Patent Application No. PCT/JP2018/015783, filed on Apr. 17, 2018, which in turn claims the benefit of Japanese Application No. 2017-108699, filed on May 31, 2017, the entire disclosures of which Applications are incorporated by reference herein.

TECHNICAL FIELD

The present invention relates to a diagnostic apparatus that diagnoses whether there is an anomaly in a circuit.

BACKGROUND ART

In a system of controlling a motor through Pulse Width Modulation (PWM) control, digital control using a microprocessor is widely employed. To control a motor, a current that flows through a winding of the motor (hereinafter, a motor current) needs to be detected. In digital control, the motor current is detected in each PWM cycle where a PWM switching timing is generated, and the motor is controlled through, for example, PI control (proportional+integral control) to make the motor current match a current command value. Torque output by a surface permanent magnet synchronous motor used in an FA servo is in a proportional relationship with the motor current. Thus, the torque output from the motor can be controlled freely by controlling the value of the motor current through PWM control.

Meanwhile, as a method of stopping a motor in an emergency, a technique for reducing the risk of failure in an emergency stop circuit has been proposed (see, for example, PTL 1). In such an existing emergency stop circuit, a system in the emergency stop circuit is dualized, as illustrated in FIG. 11, and thus the emergency stop circuit can stop the motor even if either one of the systems in the emergency stop circuit has failed.

Furthermore, in recent years, in order to achieve cooperation between humans and industrial robots, there are works toward regulating the moving speed and the movement range of robot arms, for example. An extension device is connected to an existing control device, and encoder information of a motor is retrieved by the extension device to monitor the rotary speed of a motor shaft and the movement range.

CITATION LIST

Patent Literature

PTL 1: Japanese Unexamined Patent Application Publication No. 2006-268130

SUMMARY OF THE INVENTION

Technical Problem

With the configuration of the existing emergency stop circuit, however, a failure in the emergency stop circuit that occurs with the extension device connected to the control device cannot be detected.

Solutions to Problem

A diagnostic apparatus according to the present invention comprises a control device; and an extension device connectable to the control device, wherein the control device includes: a cutoff block that switches between allowing and cutting off power supply to a load; a first diagnostic pulse generator that generates a diagnostic signal indicating that the power supply to the load is to be cut off; a first cutoff diagnosing device that detects a supply voltage to the load; and an extension device detector that determines whether the extension device is connected to the control device, the extension device includes: a second diagnostic pulse generator that generates the diagnostic signal; and a second cutoff diagnosing device that detects a supply voltage to the load, when the extension device detector has determined that the extension device is not connected to the control device, the first diagnostic pulse generator outputs the diagnostic signal to the cutoff block, the cutoff block cuts off the power supply to the load in response to the diagnostic signal output from the first diagnostic pulse generator, and the first cutoff diagnosing device diagnoses whether there is a failure in the cutoff block based on the supply voltage to the load that is detected, and when the extension device detector has determined that the extension device is connected to the control device, the second diagnostic pulse generator outputs the diagnostic signal to the cutoff block, the cutoff block cuts off the power supply to the load in response to the diagnostic signal output from the second diagnostic pulse generator, and the second cutoff diagnosing device diagnoses whether there is a failure in the cutoff block based on the supply voltage to the load that is detected.

A diagnostic apparatus according to the present invention comprises a motor controlling device; and an extension device connectable to the motor controlling device, wherein the motor controlling device includes: an inverter circuit that controls a voltage to be applied to a motor through Pulse Width Modulation (PWM) control; a driving circuit that drives the inverter circuit; a cutoff circuit that switches between allowing and cutting off power supply to the driving circuit; a first diagnostic pulse generator that generates a diagnostic signal indicating that the power supply to the driving circuit is to be cut off; a first cutoff diagnosing device that detects a supply voltage to the driving circuit; and an extension device detector that determines whether the extension device is connected to the motor controlling device, the extension device includes: a second diagnostic pulse generator that generates the diagnostic signal; and a second cutoff diagnosing device that detects a supply voltage to the driving circuit, when the extension device detector has determined that the extension device is not connected to the motor controlling device, the first diagnostic pulse generator outputs the diagnostic signal to the cutoff circuit, the cutoff circuit cuts off the power supply to the driving circuit in response to the diagnostic signal output from the first diagnostic pulse generator, and the first cutoff diagnosing device diagnoses whether there is a failure in the cutoff circuit based on the supply voltage to the driving circuit that is detected, and when the extension device detector has determined that the extension device is connected to the motor controlling device, the second diagnostic pulse generator outputs the diagnostic signal to the cutoff circuit, the cutoff circuit cuts off the power supply to the driving circuit in response to the diagnostic signal output from the second diagnostic pulse generator, and the second cutoff diagnosing device diagnoses whether there is a failure in the cutoff circuit based on the supply voltage to the driving circuit that is detected.

Advantageous Effect of Invention

The diagnostic apparatus configured as described above can detect a failure in the cutoff circuit, or an emergency stop circuit, that occurs with the extension device connected to the control device.

BRIEF DESCRIPTION OF DRAWINGS

FIG. 3 is a general diagram showing combination patterns of an extension device and results from an extension device detector according to Embodiment 1.

FIG. 5 is a general diagram showing combination patterns of an extension device and results from an extension device detector according to Embodiment 2.

FIG. 8 is a general diagram showing combination patterns of an extension device and results from an extension device detector according to Embodiment 3.

FIG. 10 is a general diagram showing combination patterns of an extension device and results from an extension device detector according to Embodiment 4.

DESCRIPTION OF EXEMPLARY EMBODIMENTS

Figure 1:
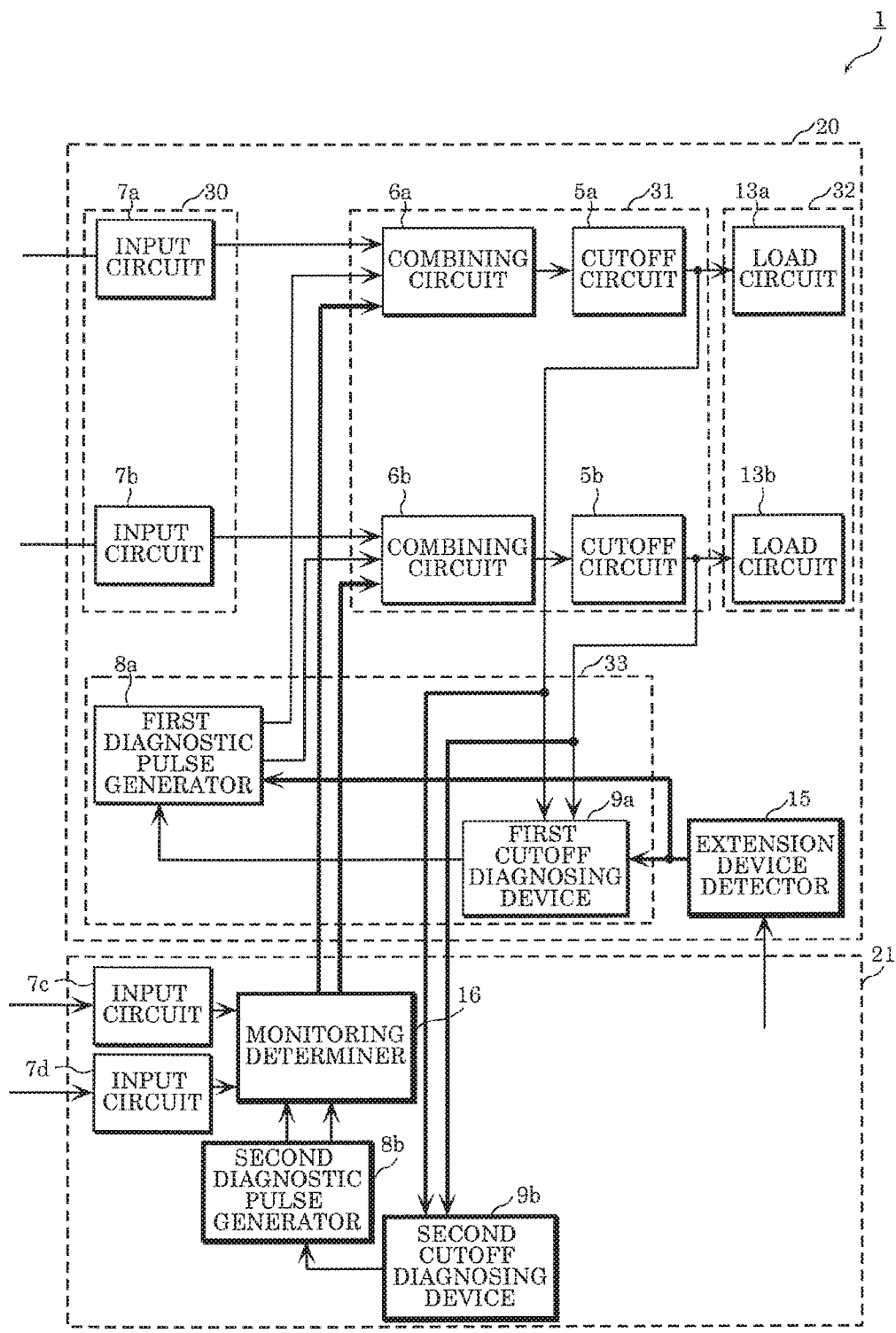
FIG. 1 is a block configuration diagram of a diagnostic apparatus according to Embodiment 1.

A diagnostic apparatus according to one aspect of the present disclosure includes a control device and an extension device connectable to the control device. The control device includes a cutoff block that switches between allowing and cutting off power supply to a load, a first diagnostic pulse generator that generates a diagnostic signal indicating that the power supply to the load is to be cut off, a first cutoff diagnosing device that detects a supply voltage to the load, and an extension device detector that determines whether the extension device is connected to the control device. The extension device includes a second diagnostic pulse generator that generates the diagnostic signal, and a second cutoff diagnosing device that detects a supply voltage to the load. When the extension device detector has determined that the extension device is not connected to the control device, the first diagnostic pulse generator outputs the diagnostic signal to the cutoff block, the cutoff block cuts off the power supply to the load in response to the diagnostic signal output from the first diagnostic pulse generator, and the first cutoff diagnosing device diagnoses whether there is a failure in the cutoff block based on the supply voltage to the load that is detected. When the extension device detector has determined that the extension device is connected to the control device, the second diagnostic pulse generator outputs the diagnostic signal to the cutoff block, the cutoff block cuts off the power supply to the load in response to the diagnostic signal output from the second diagnostic pulse generator, and the second cutoff diagnosing device diagnoses whether there is a failure in the cutoff block based on the supply voltage to the load that is detected.

The diagnostic apparatus configured as described above can detect a failure in the cutoff block, or an emergency stop circuit, that occurs with the extension device connected.

The first diagnostic pulse generator and the second diagnostic pulse generator may output the diagnostic signal to the cutoff block at different cycles or with different phases.

This configuration makes it relatively easier to detect an anomalous state in which the extension device detector determines that the extension device is not connected although the extension device is connected and an anomalous state in which the extension device detector determines that the extension device is connected although the extension device is not connected.

When the extension device detector has determined that the extension device is connected to the control device, the first cutoff diagnosing device may further diagnose whether there is a failure in the extension device on the basis of whether the diagnostic signal output from the second diagnostic pulse generator is detected.

This configuration makes it possible to diagnose whether there is a failure in the extension device.

A diagnostic apparatus according to one aspect of the present disclosure includes a motor controlling device and an extension device connectable to the motor controlling device. The motor controlling device includes an inverter circuit that controls a voltage to be applied to a motor through Pulse Width Modulation (PWM) control, a driving circuit that drives the inverter circuit, a cutoff circuit that switches between allowing and cutting off power supply to the driving circuit, a first diagnostic pulse generator that generates a diagnostic signal indicating that the power supply to the driving circuit is to be cut off, a first cutoff diagnosing device that detects a supply voltage to the driving circuit, and an extension device detector that determines whether the extension device is connected to the motor controlling device. The extension device includes a second diagnostic pulse generator that generates the diagnostic signal, and a second cutoff diagnosing device that detects a supply voltage to the driving circuit. When the extension device detector has determined that the extension device is not connected to the motor controlling device, the first diagnostic pulse generator outputs the diagnostic signal to the cutoff circuit, the cutoff circuit cuts off the power supply to the driving circuit in response to the diagnostic signal output from the first diagnostic pulse generator, and the first cutoff diagnosing device diagnoses whether there is a failure in the cutoff circuit on the basis of the supply voltage to the driving circuit that is detected. When the extension device detector has determined that the extension device is connected to the motor controlling device, the second diagnostic pulse generator outputs the diagnostic signal to the cutoff circuit, the cutoff circuit cuts off the power supply to the driving circuit in response to the diagnostic signal output from the second diagnostic pulse generator, and the second cutoff diagnosing device diagnoses whether there is a failure in the cutoff circuit on the basis of the supply voltage to the driving circuit that is detected.

The diagnostic apparatus configured as described above can detect a failure in the cutoff circuit, or an emergency stop circuit, that occurs with the extension device connected to the motor controlling device.

The first diagnostic pulse generator and the second diagnostic pulse generator may output the diagnostic signal to the cutoff circuit at different cycles or with different phases.

This configuration makes it relatively easier to detect an anomalous state in which the extension device detector determines that the extension device is not connected although the extension device is connected and an anomalous state in which the extension device detector determines that the extension device is connected although the extension device is not connected.

When the extension device detector has determined that the extension device is connected to the motor controlling device, the first cutoff diagnosing device may further diagnose whether there is a failure in the extension device on the basis of whether the diagnostic signal output from the second diagnostic pulse generator is detected.

This configuration makes it possible to diagnose whether there is a failure in the extension device.

Hereinafter, embodiments of the present invention will be described with reference to the drawings.

The embodiments described below merely illustrate preferred specific examples of the present invention. The numerical values, the shapes, the materials, the constituent elements, the arrangement positions and the connection modes of the constituent elements, the steps, the orders of the steps, and so on illustrated in the following embodiments are examples and are not intended to limit the present invention. The present invention is limited only by the claims. Accordingly, among the constituent elements in the following embodiments, any constituent element that is not described in the independent claims expressing the broadest concept of the present invention is not necessarily required in order to overcome the problem faced by the present invention but is described as an element constituting a more preferred embodiment.

Embodiment 1

Diagnostic apparatus 1 according to Embodiment 1 will be described with reference to FIGS. 1 to 3.

FIG. 1 is a block configuration diagram of diagnostic apparatus 1 according to Embodiment 1. FIG. 2 is an operating waveform diagram of diagnostic apparatus 1. FIG. 3 illustrates an operation in each combination pattern of extension device 21 and results from extension device detector 15. Each operation will be described below.

As illustrated in FIG. 1, diagnostic apparatus 1 includes control device 20 and extension device 21 connectable to control device 20. Control device 20 includes, for example, a block that causes a function, such as motor control and signal processing, to operate (in FIG. 1, load 32 described later), a block that causes the function to stop in response to a stop signal from the outside (in FIG. 1, input block 30 and cutoff block 31 described later), and a block that diagnoses whether a means that stops the function is operating normally (in FIG. 1, diagnostic block 33 described later).

Extension device 21 can be freely connected to or disconnected from control device 20. Extension device 21 is a device that can be added to monitor, in response to receiving a monitor signal from the outside, whether the function of control device 20 is operating as instructed.

First, an operation of control device 20 will be described below.

Control device 20 includes input block 30, cutoff block 31, load 32, diagnostic block 33, and extension device detector 15. In the illustrated example, a system from input block 30 to cutoff block 31 and to load 32 is dualized in control device 20. Alternatively, a system that does not require high reliability can have a single-system configuration without backup redundancy.

Load 32 includes load circuits 13a and 13b. Load circuits 13a and 13b are each, for example, a circuit that causes control device 20 to operate, such as a motor driver or a signal processing circuit.

Cutoff block 31 includes combining circuits 6a and 6b and cutoff circuits 5a and 5b. Cutoff block 31 switches between allowing and cutting off power supply to load 32. Cutoff circuits 5a and 5b are circuits that allow or cut off supply of power source for causing respective load circuits 13a and 13b to operate. Cutoff circuits 5a and 5b switch between allowing and cutting off the supply of power source in response to a command from the combining circuits described below. Combining circuits 6a and 6b output, to respective cutoff circuits 5a and 5b, a command to allow or cut off the supply of power source in response to a stop signal received from the outside through input block 30 and a diagnostic signal described later.

Input block 30 includes input circuits 7a and 7b. Input block 30 takes in, through digital filtering processing, a stop signal input from the outside and outputs the stop signal to combining circuits 6a and 6b.

Diagnostic block 33 includes first diagnostic pulse generator 8a and first cutoff diagnosing device 9a. First diagnostic pulse generator 8a periodically generates a diagnostic signal indicating that power supply to load 32 is to be cut off. This diagnostic signal is input to combining circuits 6a and 6b to control cutoff circuits 5a and 5b to allow or cut off the supply of power source. First cutoff diagnosing device 9a detects a supply voltage to load 32. To be more specific, first cutoff diagnosing device 9a makes a diagnosis of a normality or an anomaly by detecting the power source output from cutoff circuits 5a and 5b.

Extension device detector 15 determines whether extension device 21 is connected to control device 20. To be more specific, extension device detector 15 determines whether extension device 21 is connected and transmits information as to the presence of connection to first diagnostic pulse generator 8a and first cutoff diagnosing device 9a.

The above describes the configuration of control device 20. A configuration of extension device 21 will now be described.

Extension device 21 includes second diagnostic pulse generator 8b, second cutoff diagnosing device 9b, input circuits 7c and 7d, and monitoring determiner 16.

Second diagnostic pulse generator 8b periodically generates a diagnostic signal. This diagnostic signal is input to combining circuits 6a and 6b of control device 20 via monitoring determiner 16 described later to control cutoff circuits 5a and 5b to allow or cut off the supply of power source.

Second cutoff diagnosing device 9b detects a supply voltage to load 32. To be more specific, second cutoff diagnosing device 9b makes a diagnosis of a normality or an anomaly by detecting the power source output from cutoff circuits 5a and 5b.

Input circuits 7c and 7d take in, through digital filtering processing, a monitor signal input from the outside.

Monitoring determiner 16 monitors an operation of load circuits 13a and 13b, in response to receiving a monitor signal from input circuits 7c and 7d. If monitoring determiner 16 has determined that the operation is different from a preset operation, monitoring determiner 16 outputs a stop signal to combining circuits 6a and 6b of control device 20 to cut off the supply of power source to load circuits 13a and 13b. In response to receiving a diagnostic signal from second diagnostic pulse generator 8b described above, monitoring determiner 16 outputs a diagnostic signal to combining circuits 6a and 6b. With regard to the stop signal of monitoring determiner 16 and the diagnostic signal, the stop signal is processed preferentially.

The above describes the configuration of extension device 21. An operation in a diagnostic method will now be described with reference to FIG. 2.

When extension device detector 15 has determined that extension device 21 is not connected to control device 20, first diagnostic pulse generator 8a outputs a diagnostic signal to cutoff block 31. In response to the diagnostic signal output from first diagnostic pulse generator 8a, cutoff block 31 cuts off power supply to load 32, and first cutoff diagnosing device 9a diagnoses whether there is a failure in cutoff block 31 on the basis of a detected supply voltage to load 32. To be more specific, diagnostic apparatus 1 performs the operation described below in the foregoing case.

When extension device detector 15 has determined that extension device 21 is not connected to control device 20, extension device detector 15 outputs an unconnected signal to first diagnostic pulse generator 8a and first cutoff diagnosing device 9a to inform them that control device 20 is in standalone operation. The case where the output of extension device detector 15 is H as illustrated in FIG. 2 yields an operating waveform indicating that extension device 21 is unconnected. As illustrated in FIG. 2, first diagnostic pulse generator 8a outputs a diagnostic signal (L pulse) to combining circuits 6a and 6b. Thus, combining circuits 6a and 6b output signals to respective cutoff circuits 5a and 5b of the following stage, and cutoff circuits 5a and 5b cut off the supply of power source in accordance with the diagnostic signal. The diagnostic signal is output to combining circuit 6a and combining circuit 6b in an alternating manner, and this keeps the power source to load circuit 13a and the power source to load circuit 13b from being cut off simultaneously. When first cutoff diagnosing device 9a has detected an anomaly, first cutoff diagnosing device 9a outputs a power source cutoff command to first diagnostic pulse generator 8a, and first diagnostic pulse generator 8a brings the signals to combining circuits 6a and 6b simultaneously to an L level to stop the supply of power supply to the load circuits, causing the operation of load 32 to stop.

When extension device detector 15 has determined that extension device 21 is connected to control device 20, second diagnostic pulse generator 8b outputs a diagnostic signal to cutoff block 31. In response to the diagnostic signal output from second diagnostic pulse generator 8b, cutoff block 31 cuts off power supply to load 32, and second cutoff diagnosing device 9b diagnoses whether there is a failure in cutoff block 31 on the basis of a detected supply voltage to load 32. To be more specific, diagnostic apparatus 1 performs the operation described below in the foregoing case.

When extension device detector 15 has determined that extension device 21 is connected to control device 20, extension device detector 15 outputs a connected signal to first diagnostic pulse generator 8a and first cutoff diagnosing device 9a to inform them that extension device 21 is connected. The case where the output signal of extension device detector 15 is L as illustrated in FIG. 2 yields an operating waveform indicating that extension device 21 is connected. When first diagnostic pulse generator 8a of control device 20 has received, from extension device detector 15, a connected signal indicating that extension device 21 is connected, first diagnostic pulse generator 8a stops generating a diagnostic signal. Meanwhile, as illustrated in FIG. 2, second diagnostic pulse generator 8b of extension device 21 outputs a diagnostic signal to monitoring determiner 16. Monitoring determiner 16 outputs a diagnostic signal (L pulse) to combining circuits 6a and 6b, and cutoff circuits 5a and 5b in the following stage cut off the supply of power source in accordance with the diagnostic signal. The diagnostic signal is output to combining circuit 6a and combining circuit 6b in an alternating manner, and this keeps the power source to load circuit 13a and the power source to load circuit 13b from being cut off simultaneously. When second cutoff diagnosing device 9b has detected an anomaly, second cutoff diagnosing device 9b outputs a power source cutoff command to second diagnostic pulse generator 8b, and second diagnostic pulse generator 8b, by outputting a stop signal to monitoring determiner 16, brings the signals to combining circuits 6a and 6b simultaneously to an L level to stop the supply of power source to the load circuits, causing the operation of load 32 to stop.

As described above, the diagnostic method is switched in accordance with the determination of extension device detector 15 as to whether extension device 21 is connected, and thus the diagnosis of cutoff block 31 from extension device 21 is facilitated. Now, a diagnostic operation performed when extension device detector 15 has made a false determination as to whether extension device 21 is connected will be described.

FIG. 3 illustrates an operation in each combination pattern of extension device 21 and results from extension device detector 15. FIG. 3 illustrates the connection states of extension device 21 and the determinations made by extension device detector 15 as to the presence of extension device 21. Patterns [I] and [IV] are proper combinations, and the operation in the diagnostic method is as described above. In the following, operations in [II] and [III], or combination errors, will be described.

Described first is a case in which extension device 21 is connected but extension device detector 15 has determined that extension device 21 is not connected [III]. Since first diagnostic pulse generator 8a of control device 20 determines that control device 20 is in standalone operation, first diagnostic pulse generator 8a generates a diagnostic signal for combining circuits 6a and 6b. In addition, second diagnostic pulse generator 8b of extension device 21 generates a diagnostic signal for combining circuits 6a and 6b via monitoring determiner 16. As the cycles and/or the phases of the diagnostic signals of first diagnostic pulse generator 8a and second diagnostic pulse generator 8b are set so as not to match each other, first cutoff diagnosing device 9a and second cutoff diagnosing device 9b each detect H/L of the power source at an unexpected timing and make a determination of an anomaly. Thus, an anomaly signal is output to first diagnostic pulse generator 8a to stop the operation of load 32.

Described next is a case in which extension device 21 is not connected but extension device detector 15 has determined that extension device 21 is connected [II]. Since first diagnostic pulse generator 8a of control device 20 determines that control device 21 is connected, first diagnostic pulse generator 8a refrains from generating a diagnostic signal. In addition, since extension device 21 is actually not connected, no diagnosis is made of cutoff block 31. Meanwhile, since the power source of load 32 remains H with no change, first cutoff diagnosing device 9a outputs an anomaly signal to first diagnostic pulse generator 8a, second cutoff diagnosing device 9b outputs an anomaly signal to second diagnostic pulse generator 8b, and the operation of load 32 is stopped.

Figure 2:
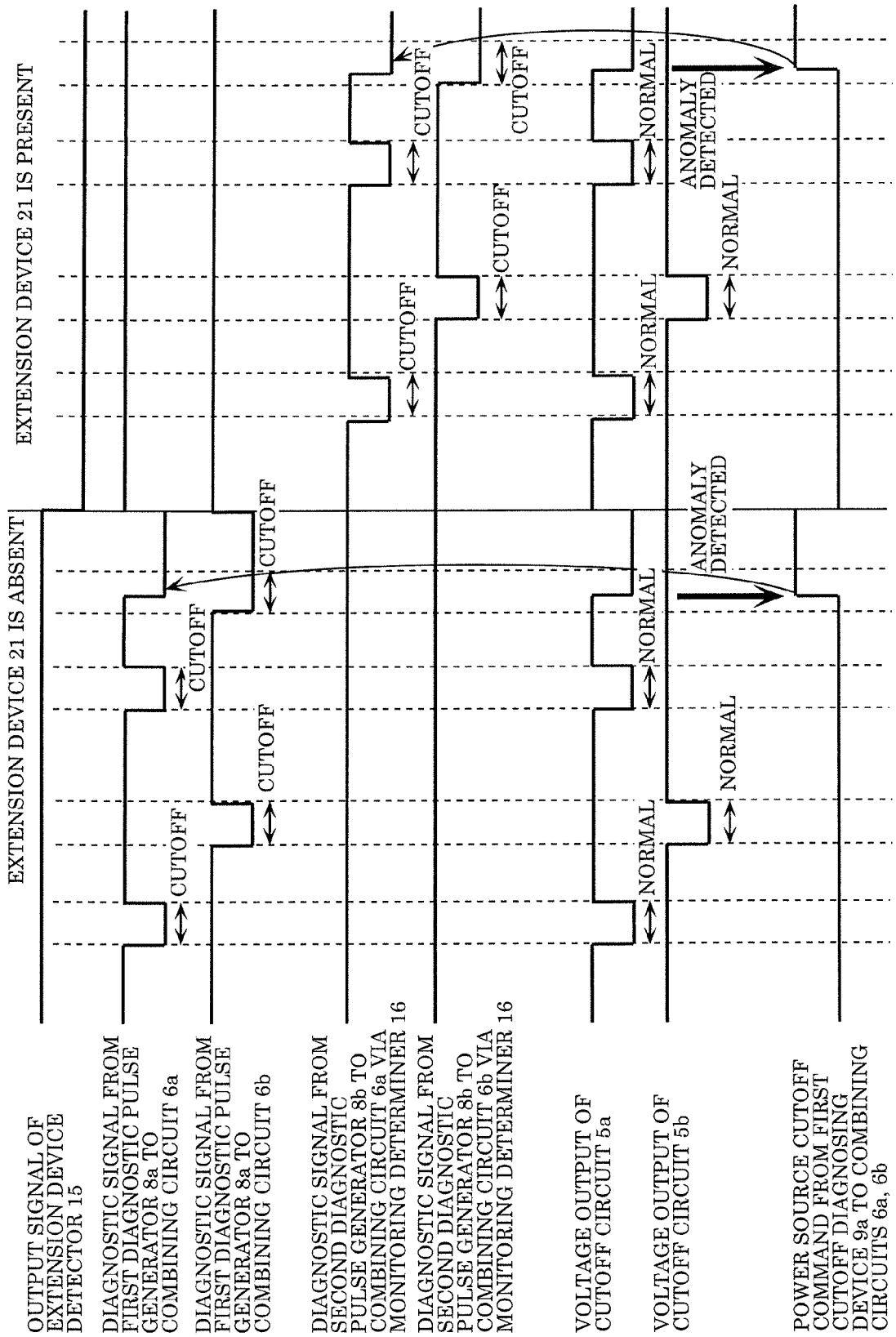
FIG. 2 is an operating waveform diagram of the diagnostic apparatus according to Embodiment 1.

FIG. 2 indicates simply that voltage outputs of cutoff circuit 5a and cutoff circuit 5b that have received a diagnostic signal drop to 0 V. However, cutoff circuit 5a and cutoff circuit 5b can be found to be operating normally if a voltage drop is detected by first cutoff diagnosing device 9a and second cutoff diagnosing device 9b. Thus, load 32 can be operated continuously by allowing cutoff circuit 5a and cutoff circuit 5b to resume immediately after the voltage drop.

With the configuration described above, a diagnosis can be made in an appropriate range by switching the path for the diagnosis even when the connection and unconnection of extension device 21 are switched.

Even when the connection state of extension device 21 is falsely determined, as first diagnostic pulse generator 8a and second diagnostic pulse generator 8b output, to cutoff block 31, diagnostic signals at different cycles or with different phases, any combination error can be detected with ease.

Embodiment 2

Figure 4:
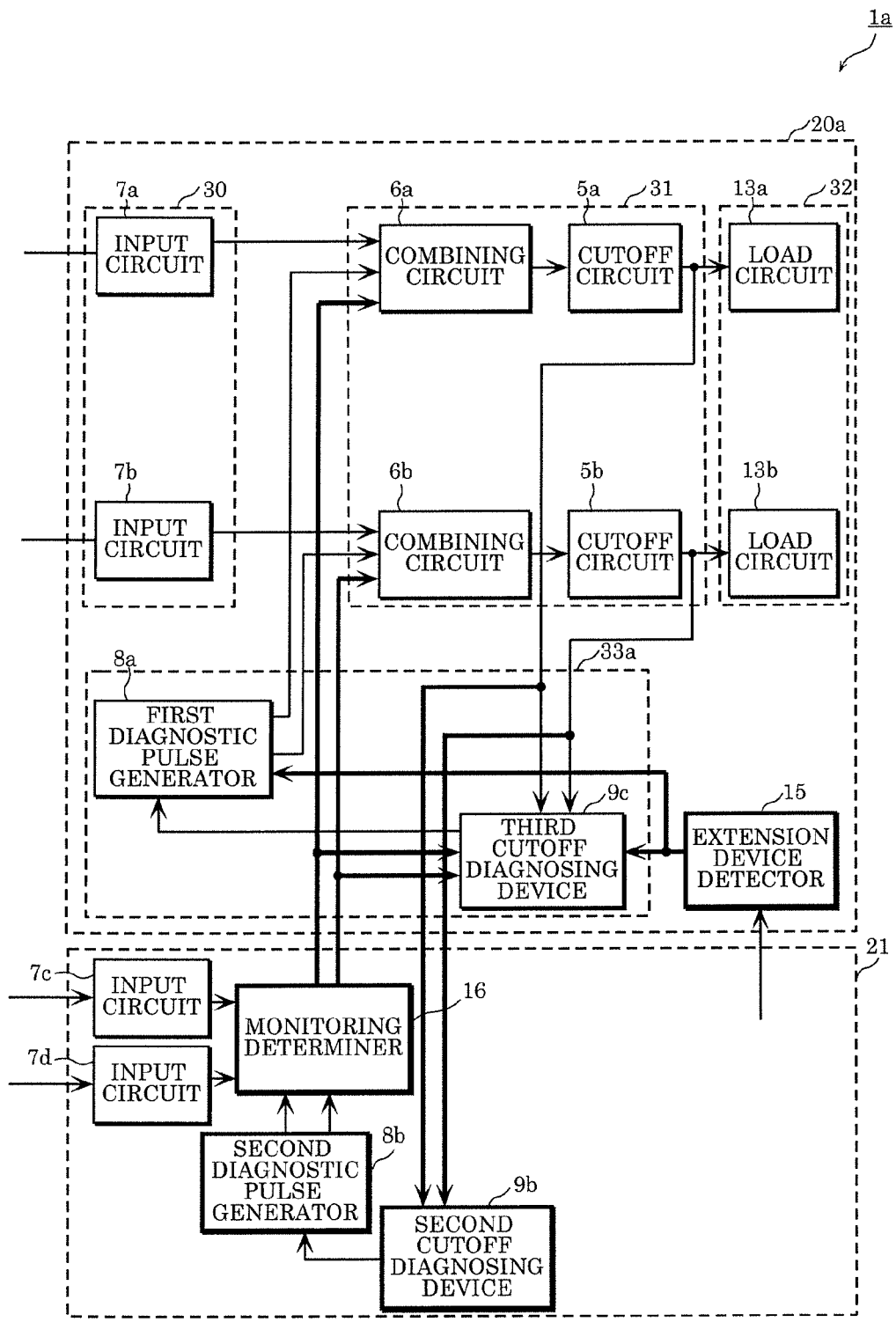
FIG. 4 is a block configuration diagram of a diagnostic apparatus according to Embodiment 2.

Embodiment 2 of the present invention will be described with reference to FIGS. 4 and 5. FIG. 4 is a block configuration diagram of diagnostic apparatus 1 a according to Embodiment 2. FIG. 5 illustrates an operation in each combination pattern of extension device 21 and results from extension device detector 15. A difference from FIG. 1 according to Embodiment 1 is as follows. When extension device 21 is connected, third cutoff diagnosing device 9c of control device 20a monitors a diagnostic signal from monitoring determiner 16 of extension device 21. The operation will be described below.

Third cutoff diagnosing device 9c according to Embodiment 2 operates in the same manner as in Embodiment 1 when control device 20a is in standalone operation. When extension device 21 is connected, third cutoff diagnosing device 9c monitors a diagnostic signal from monitoring determiner 16 of extension device 21.

FIG. 5 illustrates an operation in each combination pattern of extension device 21 and results from extension device detector 15. FIG. 5 illustrates the connection state of extension device 21 and the determinations made by extension device detector 15 as to the presence of extension device 21. Patterns [I], [III], and [IV] are similar to those in Embodiment 1. An operation in [II] will be described.

When extension device detector 15 has determined that extension device 21 is connected although extension device 21 is not connected [II], first diagnostic pulse generator 8a of control device 20a determines that extension device 21 is connected and thus refrains from generating a diagnostic signal. Meanwhile, third cutoff diagnosing device 9c monitors a diagnostic signal from monitoring determiner 16 of extension device 21 but cannot detect any diagnostic signal since extension device 21 is actually not connected. Thus, third cutoff diagnosing device 9c makes a diagnosis of an anomaly and outputs an anomaly signal to first diagnostic pulse generator 8a. In addition, second cutoff diagnosing device 9b outputs an anomaly signal to second diagnostic pulse generator 8b, and the operation of load 32 is stopped.

In this manner, when extension device detector 15 has determined that extension device 21 is connected to control device 20a, third cutoff diagnosing device 9c diagnoses whether there is a failure in extension device 21 on the basis of whether a diagnostic signal output from second diagnostic pulse generator 8b is detected.

Input circuits 7c and 7d of extension device 21 constitute two inputs. Alternatively, a plurality of input circuits may be provided, and the content to be monitored by monitoring determiner 16 may be set for each input signal from the outside.

With the configuration described above, third cutoff diagnosing device 9c monitors whether a diagnostic signal is output periodically from monitoring determiner 16 of extension device 21, and thus whether extension device 21 is connected can be determined with ease, and any anomaly of the diagnostic function can be detected with ease.

Embodiment 3

Figure 6:
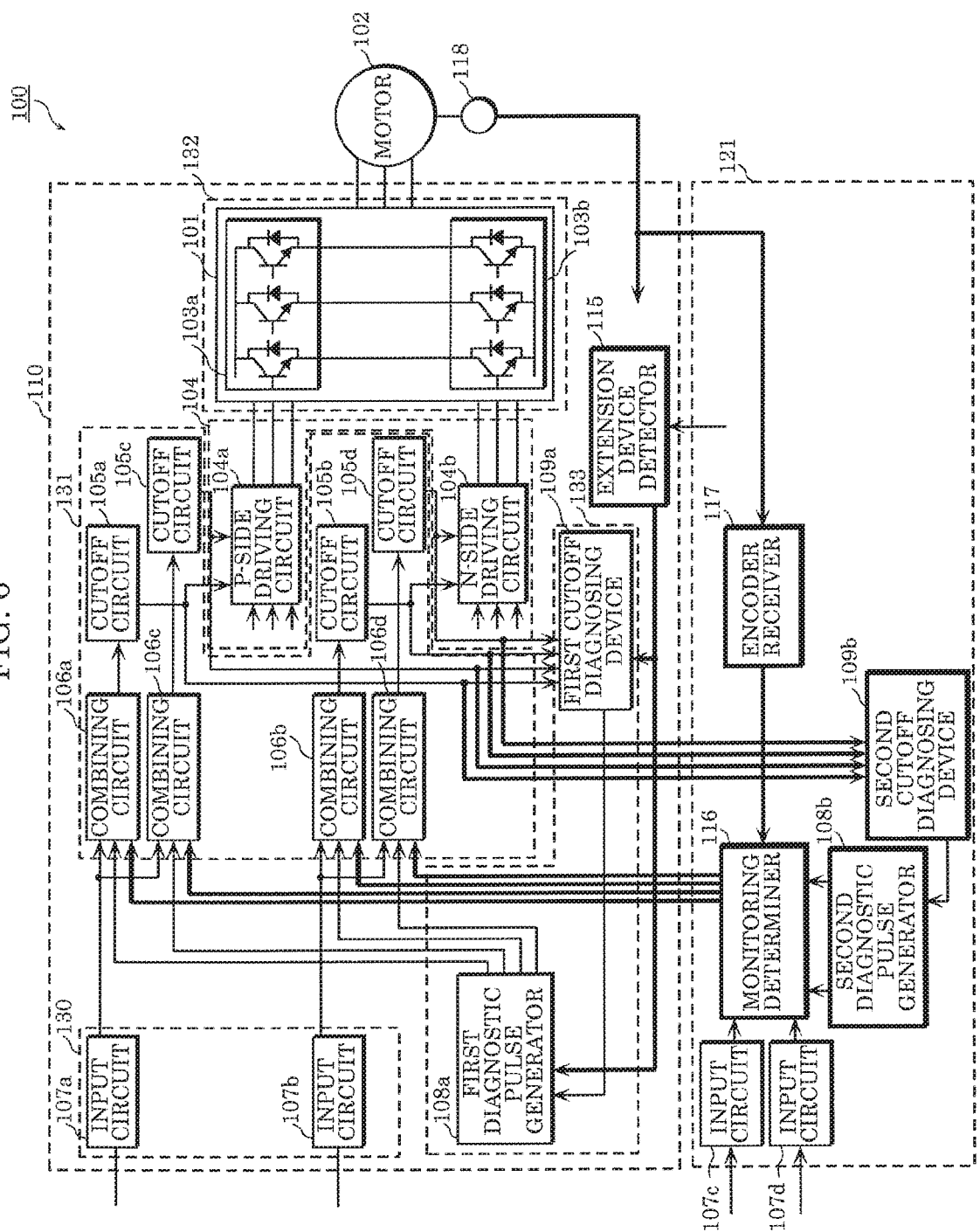
FIG. 6 is a block configuration diagram of a diagnostic apparatus according to Embodiment 3.
Figure 7:
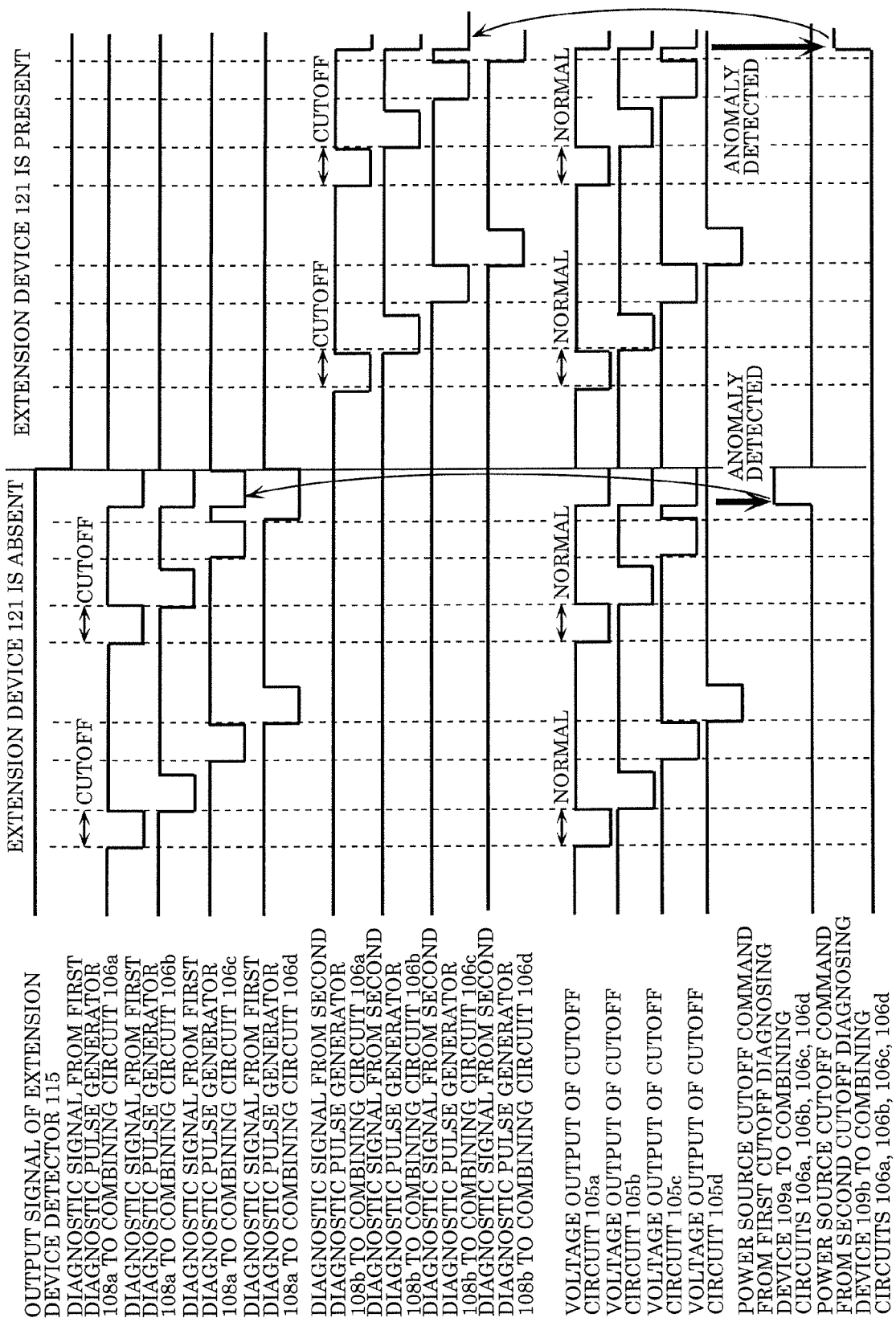
FIG. 7 is an operating waveform diagram of the diagnostic apparatus according to Embodiment 3.

Diagnostic apparatus 100 according to Embodiment 3 will be described with reference to FIGS. 6 to 8. FIG. 6 is a block configuration diagram of diagnostic apparatus 100 according to Embodiment 3. FIG. 7 is an operating waveform diagram of diagnostic apparatus 100. FIG. 8 illustrates an operation in each combination pattern of extension device 121 and results from extension device detector 115. Each operation will be described below.

As illustrated in FIG. 6, diagnostic apparatus 100 includes motor controlling device 110, extension device 121 connectable to motor controlling device 110, motor 102, and encoder 118. Each component will be described below.

102 denotes a motor, and an induction motor that rotates upon a three-phase sinusoidal wave being applied thereto or nowadays a three-phase brushless motor in which a magnet is disposed on a rotor from the viewpoint of efficiency and controllability is widely used. 118 denotes an encoder, and encoder 118 is attached to a motor shaft to detect the rotary position of the motor shaft.

A configuration of motor controlling device 110 will now be described. 101 denotes an inverter circuit, and inverter circuit 101 controls a voltage to be applied to motor 102 through Pulse Width Modulation (PWM) control. To be more specific, inverter circuit 101 is a three-phase inverter circuit and includes six power elements: P-side power elements 103a connected to a positive side (P side) of a main power source voltage and N-side power elements 103b connected to a negative side (N side) of the main power source voltage.

Driving circuit 104 includes P-side driving circuit 104a and N-side driving circuit 104b and drives inverter circuit 101.

Cutoff circuit 131 includes cutoff circuits 105a, 105b, 105c, and 105d and switches between allowing and cutting off power supply to driving circuit 104. To be more specific, cutoff circuits 105a and 105c switch between allowing and cutting off power supply to P-side driving circuit 104a, and cutoff circuits 105b and 105d switch between allowing and cutting off power supply to N-side driving circuit 104b.

P-side driving circuit 104a controls ON/OFF of P-side power elements 103a and transmits a PWM signal to P-side power elements 103a from a PWM generator (not illustrated).

N-side driving circuit 104b controls ON/OFF of N-side power elements 103b and transmits a PWM signal to N-side power elements 103b from a PWM generator (not illustrated).

P-side driving circuit 104a and N-side driving circuit 104b also have a function of providing insulation between a high-voltage primary side circuit, such as inverter circuit 101, and a low-voltage secondary side circuit, such as a control signal and an element connecting to the outside, and an insulation element, such as an optocoupler, is used. An operating power source used in P-side driving circuit 104a is supplied from cutoff circuit 105a or 105c, and P-side driving circuit 104a operates as long as the operating power source is supplied from at least either one of the cutoff circuits, yielding a logical sum configuration in which P-side driving circuit 104a can be stopped as the operating power source is cut off by each of cutoff circuits 105a and 105c. This configuration can be achieved with ease as follows. With use of two diodes, cathode terminals of the respective diodes serve as the operating power source for the optocoupler, and anode terminals of the respective diodes are connected to respective cutoff circuits 105a and 105c. The circuit on the N side is configured in a similar manner.

108a denotes a first diagnostic pulse generator, and first diagnostic pulse generator 108a periodically generates a diagnostic signal indicating that power supply to driving circuit 104 is to be cut off, as illustrated in FIG. 7, in order to check whether cutoff circuit 131 is operating properly. With regard to the cycle at which a diagnostic signal is generated, it suffices that a diagnosis be made within MTFB (mean time between failures) of cutoff circuit 131, but the diagnosis may be made at, for example, one minute interval in order to further increase the reliability.

109a denotes a first cutoff diagnosing device, and first cutoff diagnosing device 109a detects a supply voltage to driving circuit 104. To be more specific, first cutoff diagnosing device 109a detects a power source output from cutoff circuits 105a, 105b, 105c, and 105d and outputs the result to the diagnostic pulse generator. Then, first cutoff diagnosing device 109a diagnoses whether there is a failure in cutoff circuit 131 on the basis of the detected supply voltage to driving circuit 104. In an alternative configuration, first diagnostic pulse generator 108a may make a diagnosis of a failure in cutoff circuit 131 on the basis of information on the operating power source from first cutoff diagnosing device 109a.

107a and 107b denote input circuits of emergency stop signals. A redundant circuit where a plurality of signals and a plurality of circuits are used is employed in order to increase the reliability. FIG. 6 illustrates an example with input circuits of two systems, but the configuration may include a plurality of input circuits of three or more systems. With regard to emergency stop signals into input circuits of a plurality of systems, the emergency stop signals are provided simultaneously to the respective input circuits when motor 102 is to be stopped.

106a, 106b, 106c, and 106d denote combining circuits, and combining circuits 106a, 106b, 106c, and 106d combine the emergency stop signals from input circuits 107a and 107b with a diagnostic signal from first diagnostic pulse generator 108a and outputs a stop signal to each cutoff circuit. The circuit configuration of the combining circuits is determined in accordance with the logic of the emergency stop signal, or the input signals. For example, in the case of H at the time of an emergency stop, the cutoff circuits are cut off at H as a logical sum. In the case of L at the time of an emergency stop, the cutoff circuits are cut off at L as a logical product. Thus, it is possible to achieve a configuration where all the cutoff circuits are cut off in response to an emergency stop signal from the outside.

115 denotes an extension device detector, and extension device detector 115 determines whether extension device 121 is connected to motor controlling device 110. Extension device detector 115 transmits information concerning the presence of connection to first diagnostic pulse generator 108a and first cutoff diagnosing device 109a.

The above describes the configuration of motor controlling device 110. A configuration of extension device 121 will now be described.

Extension device 121 is a device for extending a monitoring function and for monitoring the speed or the position of a motor shaft in response to a monitor signal from the outside.

107c and 107d denote input circuits of monitor signals. A redundant circuit where a plurality of signals and a plurality of circuits are used is employed in order to increase the reliability. FIG. 6 illustrates an example with input circuits of two systems, but the configuration may include a plurality of input circuits of three or more systems. With regard to the monitor signals into input circuits of a plurality of systems, the monitor signals are provided simultaneously to the respective input circuits when the operation of motor 102 starts being monitored.

117 denotes an encoder receiver, and encoder receiver 117 converts rotary position information of a motor shaft received from encoder 118 into the rotary speed, the rotary position, or the rotary amount information of the motor shaft. For the rotary position information from encoder 118, serial communication, a two-phase pulse signal with 90-degree phase difference, or a two-phase sinusoidal wave signal with 90-degree phase difference, for example, is used.

116 denotes a monitoring determiner, and monitoring determiner 116, in response to receiving monitor signals from input circuits 107c and 107d, monitors whether motor 102 is operating within a preset limit. When the result has exceeded the limit, monitoring determiner 116 outputs a command to combining circuits 106a, 106b, 106c, and 106d of motor controlling device 110 to cut off the power source.

The operation of motor 102 can be detected with use of the rotary speed, the rotary position, or the rotary amount information of the motor shaft converted by encoder receiver 117.

108b denotes a second diagnostic pulse generator, and second diagnostic pulse generator 108b periodically generates a diagnostic signal, as illustrated in FIG. 7, in order to check whether cutoff circuit 131 is operating properly. With regard to the cycle at which a diagnostic signal is generated, it suffices that a diagnosis be made within MTFB (mean time between failures) of cutoff circuit 131, but the diagnosis may be made at, for example, one minute interval in order to further increase the reliability.

109b denotes a second cutoff diagnosing device, and second cutoff diagnosing device 109b detects a supply voltage to driving circuit 104. To be more specific, second cutoff diagnosing device 109b detects a power source output from cutoff circuits 105a, 105b, 105c, and 105d and outputs the result to second diagnostic pulse generator 108b. Then, second cutoff diagnosing device 109b diagnoses whether there is a failure in cutoff circuit 131 on the basis of the detected supply voltage to driving circuit 104. In an alternative configuration, second diagnostic pulse generator 108b may diagnose whether there is a failure in cutoff circuit 131 on the basis of information on the operating power source from second cutoff diagnosing device 109b.

The above describes the configuration of extension device 121. An operation in a diagnostic method will now be described with reference to FIG. 7.

When extension device detector 115 has determined that extension device 121 is not connected to motor controlling device 110, first diagnostic pulse generator 108a outputs a diagnostic signal to cutoff circuit 131. In response to the diagnostic signal output from first diagnostic pulse generator 108a, cutoff circuit 131 cuts off power supply to driving circuit 104, and first cutoff diagnosing device 109a diagnoses whether there is a failure in cutoff circuit 131 on the basis of a detected supply voltage to driving circuit 104. To be more specific, diagnostic apparatus 100 performs the operation described below in the foregoing case.

When extension device detector 115 has determined that extension device 121 is not connected to motor controlling device 110, extension device detector 115 outputs an unconnected signal to first diagnostic pulse generator 108a and first cutoff diagnosing device 109a to inform them that motor controlling device 110 is in standalone operation. The case where the output of extension device detector 115 is H as illustrated in FIG. 7 yields an operating waveform indicating that extension device 121 is unconnected. As illustrated in FIG. 7, first diagnostic pulse generator 108a outputs a diagnostic signal (L pulse) to combining circuits 106a, 106b, 106c, and 106d. Thus, combining circuits 106a, 106b, 106c, and 106d output signals to respective cutoff circuits 105a, 105b, 105c, and 105d of the following stage, and cutoff circuits 105a, 105b, 105c, and 105d cut off the supply of power source in accordance with the diagnostic signal. The diagnostic signal is output to combining circuit 106a and combining circuit 106c in an alternating manner, and this keeps the power source to P-side driving circuit 104a from being cut off. In addition, the diagnostic signal is output to combining circuit 106b and combining circuit 106d in an alternating manner, and this keeps the power source to N-side driving circuit 104b from being cut off. When first cutoff diagnosing device 109a has detected an anomaly, first cutoff diagnosing device 109a outputs a power source cutoff command to first diagnostic pulse generator 108a, and first diagnostic pulse generator 108a brings the signals to combining circuits 106a, 106b, 106c, and 106d simultaneously to an L level to stop the supply of power source to P-side driving circuit 104a and N-side driving circuit 104b, causing the passing of power When extension device detector 115 has determined that extension device 121 is connected to motor controlling device 110, second diagnostic pulse generator 108b outputs a diagnostic signal to cutoff circuit 131. In response to the diagnostic signal output from second diagnostic pulse generator 108b, cutoff circuit 131 cuts off power supply to driving circuit 104, and second cutoff diagnosing device 109b diagnoses whether there is a failure in cutoff circuit 131 on the basis of a detected supply voltage to driving circuit 104. To be more specific, diagnostic apparatus 100 performs the operation described below in the foregoing case.

When extension device detector 115 has determined that extension device 121 is connected to motor controlling device 110, extension device detector 115 outputs a connected signal to first diagnostic pulse generator 108a and first cutoff diagnosing device 109a to inform them that extension device 121 is connected. The case where the output signal of extension device detector 115 is L as illustrated in FIG. 7 yields an operating waveform indicating that extension device 121 is connected. When first diagnostic pulse generator 108a of motor controlling device 110 has received, from extension device detector 115, a connected signal indicating that extension device 121 is connected, first diagnostic pulse generator 108a stops generating a diagnostic signal. Meanwhile, as illustrated in FIG. 7, second diagnostic pulse generator 108b of extension device 121 outputs a diagnostic signal to monitoring determiner 116. Monitoring determiner 116 outputs a diagnostic signal (L pulse) to combining circuits 106a, 106b, 106c, and 106d, and cutoff circuits 105a, 105, 105c, and 105d in the following stage to cut off the supply of power source in accordance with the diagnostic signal. The diagnostic signal is output to combining circuit 106a and combining circuit 106c in an alternating manner, and this keeps the power source to P-side driving circuit 104a from being cut off In addition, the diagnostic signal is output to combining circuit 106b and combining circuit 106d in an alternating manner, and this keeps the power source to N-side driving circuit 104b from being cut off. When second cutoff diagnosing device 109b has detected an anomaly, second cutoff diagnosing device 109b outputs a power source cutoff command to second diagnostic pulse generator 108b, and second diagnostic pulse generator 108b, by outputting a stop signal to monitoring determiner 116, brings the signals to combining circuits 106a, 106b, 106c, and 106d simultaneously to an L level to stop the supply of power source to P-side driving circuit 104a and N-side driving circuit 104b, causing the passing of power to motor 102 to stop.

As described above, the diagnostic method is switched in accordance with the determination of extension device detector 115 as to whether extension device 121 is connected, and thus the diagnosis of cutoff circuit 131 from extension device 121 is facilitated. Now, a diagnostic operation performed when extension device detector 115 has made a false determination as to whether extension device 121 is connected will be described.

FIG. 8 illustrates combination patterns of extension device 121 and results from extension device detector 115. FIG. 8 illustrates the connection states of extension device 121 and the determinations made by extension device detector 115 as to the presence of extension device 121. Patterns [I] and [IV] are proper combinations, and the operation in the diagnostic method is as described above. In the following, operations in [II] and [III], or combinations errors, will be described.

Described first is a case in which extension device 121 is connected but extension device detector 115 has determined that extension device 121 is not connected [III]. Since first diagnostic pulse generator 108a of motor controlling device 110 determines that motor controlling device 110 is in standalone operation, first diagnostic pulse generator 108a generates a diagnostic signal for combining circuits 106a, 106b, 106c, and 106d. In addition, second diagnostic pulse generator 108b of extension device 121 generates a diagnostic signal for combining circuits 106a, 106b, 106c, and 106d via monitoring determiner 116. As the cycles and/or the phases of the diagnostic signals of first diagnostic pulse generator 108a and second diagnostic pulse generator 108b are set so as not to match each other, first cutoff diagnosing device 109a and second cutoff diagnosing device 109b each detect H/L of the power source at an unexpected timing and make a determination of an anomaly. Thus, an anomaly signal is output to first diagnostic pulse generator 108a to stop the passing of power to motor 102.

Described next is a case in which extension device 121 is not connected but extension device detector 115 has determined that extension device 121 is connected [II]. Since first diagnostic pulse generator 108a of motor controlling device 110 determines that control device 121 is connected, first diagnostic pulse generator 8a refrains from generating a diagnostic signal. In addition, since extension device 121 is actually not connected, no diagnosis is made of cutoff circuit 131. Meanwhile, since the power source of P-side driving circuit 104a and N-side driving circuit 104b remains H with no change, first cutoff diagnosing device 109a outputs an anomaly signal to first diagnostic pulse generator 108a, second cutoff diagnosing device 109b outputs an anomaly signal to second diagnostic pulse generator 108b, and the passing of power to motor 102 is stopped.

With the configuration described above, a diagnosis can be made in an appropriate range by switching the path for the diagnosis even when the connection and unconnection of extension device 121 are switched.

Even when the connection state of extension device 121 is falsely determined, as first diagnostic pulse generator 108a and second diagnostic pulse generator 108b output, to cutoff circuit 131, diagnostic signals at different cycles or with different phases, any combination error can be detected with ease.

Embodiment 4

Figure 9:
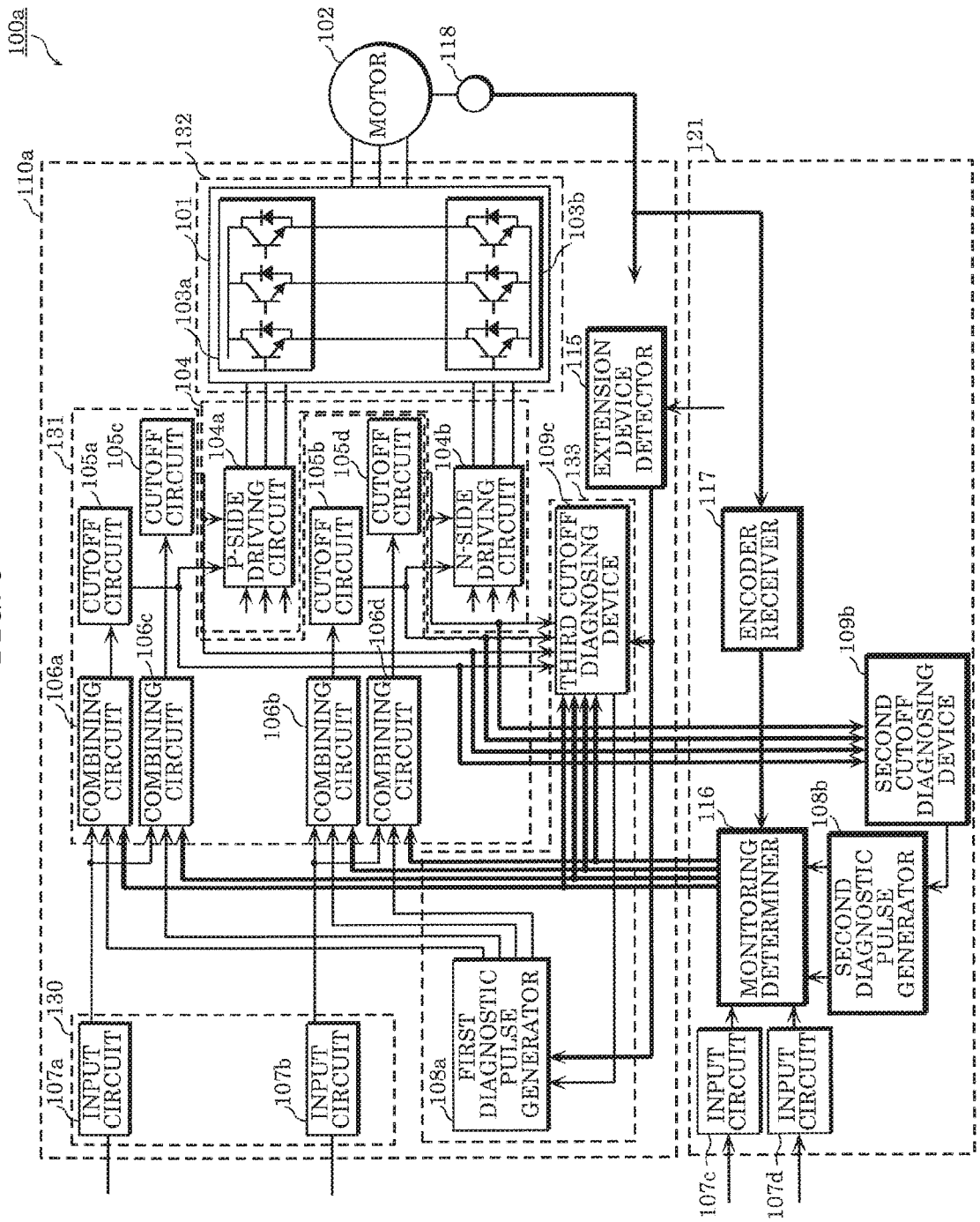
FIG. 9 is a block configuration diagram of a diagnostic apparatus according to Embodiment 4.
Figure 11:
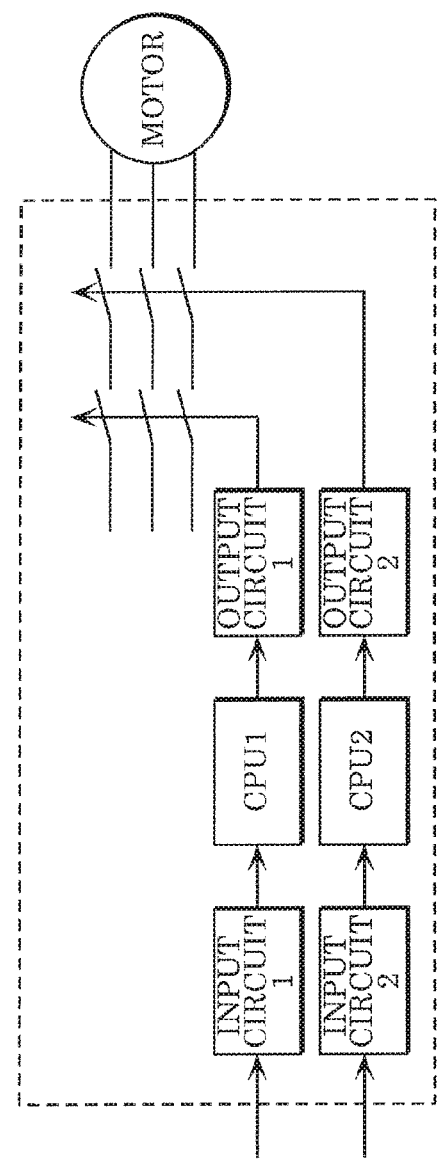
FIG. 11 is a block configuration diagram of a cutoff circuit according to an existing example.

Embodiment 4 of the present invention will be described with reference to FIGS. 9 and 10. FIG. 9 is a block configuration diagram of diagnostic apparatus 100a according to Embodiment 4. FIG. 10 illustrates an operation in each combination pattern of extension device 121 and results from extension device detector 115. A difference from FIG. 6 according to Embodiment 3 is as follows. When extension device 121 is connected, third cutoff diagnosing device 109c of motor controlling device 110 monitors a diagnostic signal from monitoring determiner 116 of extension device 121. The operation will be described below.

Third cutoff diagnosing device 109c according to Embodiment 4 operates in the same manner as in Embodiment 3 when motor controlling device 110a is in standalone operation. When extension device 121 is connected, third cutoff diagnosing device 109c monitors a diagnostic signal from monitoring determiner 116 of extension device 121.

FIG. 10 illustrates combination patterns of extension device 121 and results from the extension device detector. FIG. 10 illustrates the connection states of extension device 121 and the determinations made by extension device detector 115 as to the presence of extension device 121. Patterns [I], [III], and [IV] are similar to those in Embodiment 1. The operation in [II] will be described.

When extension device detector 115 has determined that extension device 121 is connected although extension device 121 is not connected [II], first diagnostic pulse generator 108a of motor controlling device 110a determines that extension device 121 is connected and thus refrains from generating a diagnostic signal. Meanwhile, third cutoff diagnosing device 109c monitors a diagnostic signal from monitoring determiner 116 of extension device 121 but cannot detect any diagnostic signal since extension device 121 is actually not connected. Thus, third cutoff diagnosing device 109c makes a diagnosis of an anomaly and outputs an anomaly signal to first diagnostic pulse generator 108a. In addition, second cutoff diagnosing device 109b outputs an anomaly signal to second diagnostic pulse generator 108b, and the passing of power to motor 102 is stopped.

Input circuits 107c and 107d of extension device 121 constitute two inputs. Alternatively, a plurality of input circuits may be provided, and the content to be monitored by monitoring determiner 116 may be set for each input signal from the outside.

With the configuration described above, third cutoff diagnosing device 109c monitors whether a diagnostic signal is output periodically from monitoring determiner 116 of extension device 121, and thus whether extension device 121 is connected can be determined with ease, and any anomaly of the diagnostic function can be detected with ease.

INDUSTRIAL APPLICABILITY

The present invention can find its use broadly in a diagnostic apparatus that diagnoses whether there is an anomaly in a circuit.

REFERENCE MARKS IN THE DRAWINGS 1, 1a, 100, 100a diagnostic apparatus
8a, 108a first diagnostic pulse generator
8b, 108b second diagnostic pulse generator
9a, 109a first cutoff diagnosing device
9b, 109b second cutoff diagnosing device
9c, 109c third cutoff diagnosing device
15, 115 extension device detector
20, 20a control device
21, 21a, 121, 121a extension device
31 cutoff block
32 load
101 inverter circuit
102 motor
104 driving circuit
105a, 105b, 105c, 105d, 131 cutoff circuit
110, 110a motor controlling device

The invention claimed is:
1. A diagnostic apparatus, comprising:
a control device; and
an extension device connectable to the control device,
wherein the control device includes:
a cutoff block that switches between allowing and cutting off power supply to a load;
a first diagnostic pulse generator that generates a first diagnostic signal indicating that the power supply to the load is to be cut off;
a first cutoff diagnosing device that detects a supply voltage to the load; and
an extension device detector that determines whether the extension device is connected to the control device,
the extension device includes:
a second diagnostic pulse generator that generates a second diagnostic signal; and
a second cutoff diagnosing device that detects a supply voltage to the load,
when the extension device detector has determined that the extension device is not connected to the control device,
the first diagnostic pulse generator outputs the first diagnostic signal to the cutoff block,
the cutoff block cuts off the power supply to the load in response to the first diagnostic signal output from the first diagnostic pulse generator, and
the first cutoff diagnosing device diagnoses whether there is a failure in the cutoff block based on the supply voltage to the load that is detected, and
when the extension device detector has determined that the extension device is connected to the control device,
the second diagnostic pulse generator outputs the second diagnostic signal to the cutoff block,
the cutoff block cuts off the power supply to the load in response to the second diagnostic signal output from the second diagnostic pulse generator, and
the second cutoff diagnosing device diagnoses whether there is a failure in the cutoff block based on the supply voltage to the load that is detected.

2. The diagnostic apparatus according to claim 1, wherein the first diagnostic signal and the second diagnostic signal are outputted to the cutoff block at different cycles or with different phases.

3. The diagnostic apparatus according to claim 1, wherein when the extension device detector has determined that the extension device is connected to the control device, the first cutoff diagnosing device further diagnoses whether there is a failure in the extension device based on whether the second diagnostic signal output from the second diagnostic pulse generator is detected.

4. A diagnostic apparatus, comprising:
a motor controlling device; and
an extension device connectable to the motor controlling device, wherein the motor controlling device includes:
    an inverter circuit that controls a voltage to be applied to a motor through Pulse Width Modulation (PWM) control;
    a driving circuit that drives the inverter circuit;
    a cutoff circuit that switches between allowing and cutting off power supply to the driving circuit;
    a first diagnostic pulse generator that generates a first diagnostic signal indicating that the power supply to the driving circuit is to be cut off;
    a first cutoff diagnosing device that detects a supply voltage to the driving circuit; and
    an extension device detector that determines whether the extension device is connected to the motor controlling device,
the extension device includes:
    a second diagnostic pulse generator that generates a second diagnostic signal; and
    a second cutoff diagnosing device that detects a supply voltage to the driving circuit,
when the extension device detector has determined that the extension device is not connected to the motor controlling device,
    the first diagnostic pulse generator outputs the first diagnostic signal to the cutoff circuit,
    the cutoff circuit cuts off the power supply to the driving circuit in response to the first diagnostic signal output from the first diagnostic pulse generator, and
    the first cutoff diagnosing device diagnoses whether there is a failure in the cutoff circuit based on the supply voltage to the driving circuit that is detected, and
when the extension device detector has determined that the extension device is connected to the motor controlling device,
    the second diagnostic pulse generator outputs the second diagnostic signal to the cutoff circuit,
    the cutoff circuit cuts off the power supply to the driving circuit in response to the second diagnostic signal output from the second diagnostic pulse generator, and
    the second cutoff diagnosing device diagnoses whether there is a failure in the cutoff circuit based on the supply voltage to the driving circuit that is detected.

5. The diagnostic apparatus according to claim 4, wherein the first diagnostic signal and the second diagnostic signal are outputted to the cutoff circuit at different cycles or with different phases.

6. The diagnostic apparatus according to claim 4, wherein when the extension device detector has determined that the extension device is connected to the motor controlling device, the first cutoff diagnosing device further diagnoses whether there is a failure in the extension device based on whether the second diagnostic signal output from the second diagnostic pulse generator is detected.

* * * * *